(12) United States Patent
Miwa et al.

(10) Patent No.: US 11,508,760 B2
(45) Date of Patent: Nov. 22, 2022

(54) ACTIVE-MATRIX SUBSTRATE AND DISPLAY DEVICE

(71) Applicant: SHARP KABUSHIKI KAISHA, Sakai (JP)

(72) Inventors: Masahiko Miwa, Sakai (JP); Yohsuke Kanzaki, Sakai (JP); Takao Saitoh, Sakai (JP); Masaki Yamanaka, Sakai (JP); Yi Sun, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 153 days.

(21) Appl. No.: 16/980,172

(22) PCT Filed: Mar. 15, 2018

(86) PCT No.: PCT/JP2018/010178
§ 371 (c)(1),
(2) Date: Sep. 11, 2020

(87) PCT Pub. No.: WO2019/176040
PCT Pub. Date: Sep. 19, 2019

(65) Prior Publication Data
US 2021/0013244 A1    Jan. 14, 2021

(51) Int. Cl.
*H01L 27/32* (2006.01)
*H01L 27/12* (2006.01)

(52) U.S. Cl.
CPC ...... *H01L 27/1248* (2013.01); *H01L 27/3258* (2013.01); *H01L 27/127* (2013.01); *H01L 2227/323* (2013.01)

(58) Field of Classification Search
CPC ............. H01L 27/0922; H01L 27/1222; H01L 27/1248; H01L 27/127; H01L 27/3258; H01L 29/7843
See application file for complete search history.

(56) References Cited

U.S. PATENT DOCUMENTS

| | | | |
|---|---|---|---|
| 6,323,070 B1* | 11/2001 | Yamazaki | H01L 27/1277 257/E27.111 |
| 6,346,718 B1* | 2/2002 | Yamanaka | H01L 29/78648 257/E21.415 |
| 2003/0040158 A1* | 2/2003 | Saitoh | H01L 29/7843 257/E21.438 |
| 2007/0024321 A1* | 2/2007 | Lin | H01L 21/823864 257/E21.64 |
| 2010/0163874 A1 | 7/2010 | Koyama et al. | |
| 2014/0357019 A1 | 12/2014 | Koyama et al. | |

(Continued)

FOREIGN PATENT DOCUMENTS

| | | |
|---|---|---|
| JP | 2001-250949 A | 9/2001 |
| JP | 2017-152704 A | 8/2017 |
| JP | 2017-173505 A | 9/2017 |

*Primary Examiner* — Bryan R Junge
(74) *Attorney, Agent, or Firm* — ScienBiziP, P.C.

(57) ABSTRACT

An active matrix substrate includes a plurality of first contact holes extending through an inorganic insulating film, a first protection layer that is a silicon nitride film, and a second protection layer, a plurality of second contact holes extending through the inorganic insulating film and the second protection layer, a first transistor, and a second transistor. A channel region of the second transistor does not overlap the first protection layer.

20 Claims, 8 Drawing Sheets

(56) References Cited

U.S. PATENT DOCUMENTS

| | | | |
|---|---|---|---|
| 2016/0071887 A1* | 3/2016 | Chao | H01L 27/1229 257/72 |
| 2016/0358950 A1 | 12/2016 | Koyama et al. | |
| 2017/0025448 A1 | 1/2017 | Koyama et al. | |
| 2017/0104018 A1* | 4/2017 | Yamazaki | H01L 29/66969 |
| 2017/0278916 A1 | 9/2017 | Maruyama | |

* cited by examiner

ACTIVE-MATRIX SUBSTRATE AND DISPLAY DEVICE

TECHNICAL FIELD

The disclosure relates to an active matrix substrate and a display device.

BACKGROUND ART

PTL 1 discloses providing a silicon nitride layer directly in contact with an oxide semiconductor layer applied to a resistor element, and providing a silicon nitride layer on an oxide semiconductor layer applied to a thin film transistor via a silicon oxide layer.

CITATION LIST

Patent Literature

PTL1: JP 2017-152704 A

SUMMARY

Technical Problem

In the known technique, it has been difficult to form, on one active matrix substrate, a plurality of transistors having different properties according to each application.

Solution to Problem

An active matrix substrate according to one aspect of the disclosure includes a first transistor being a low-temperature polysilicon transistor, the first transistor including a first semiconductor film and a first gate electrode, a second transistor including a second semiconductor film formed of the same material as a material of the first semiconductor film and formed in the same layer as the first semiconductor film, and a second gate electrode, a plurality of first contact holes extending through a gate insulating film, a first protection layer being a silicon nitride film, and a second protection layer, and a plurality of second contact holes extending through the gate insulating film and the second protection layer, where a source region and a drain region of the first semiconductor film of the first transistor are electrically connected to a first source electrode and a first drain electrode via the plurality of first contact holes, respectively, a source region and a drain region of the second semiconductor film of the second transistor are electrically connected to a second source electrode and a second drain electrode via the plurality of second contact holes, respectively, and a channel region between the source region and the drain region of the second transistor does not overlap the first protection layer.

Advatageous Effects of Disclosure

According to one aspect of the disclosure, a plurality of transistors having properties different from each other can be easily formed on one active matrix substrate. Thus, the plurality of transistors can be provided with a property suitable for each application.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
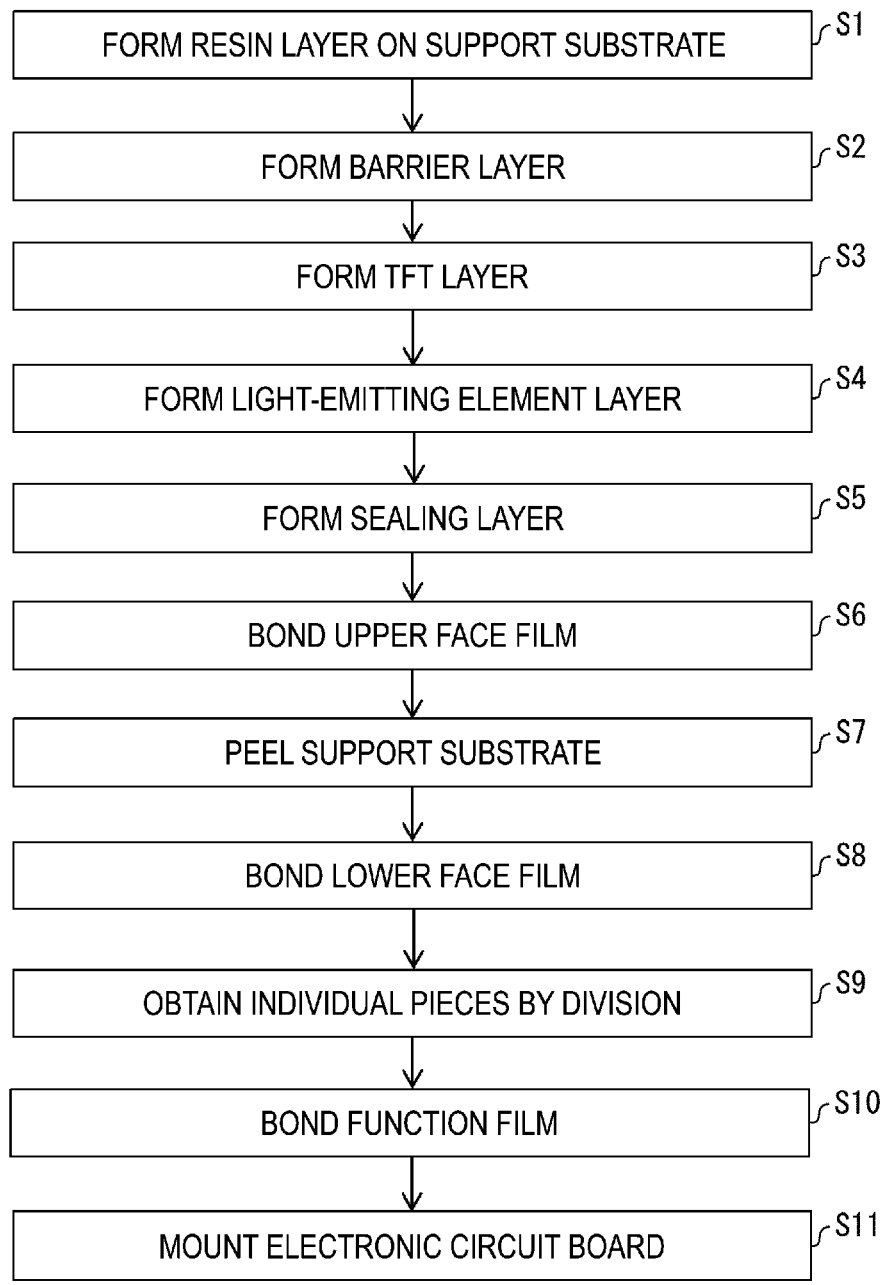
FIG. 1 is a flowchart illustrating an example of a manufacturing method of a display device.
Figure 2:
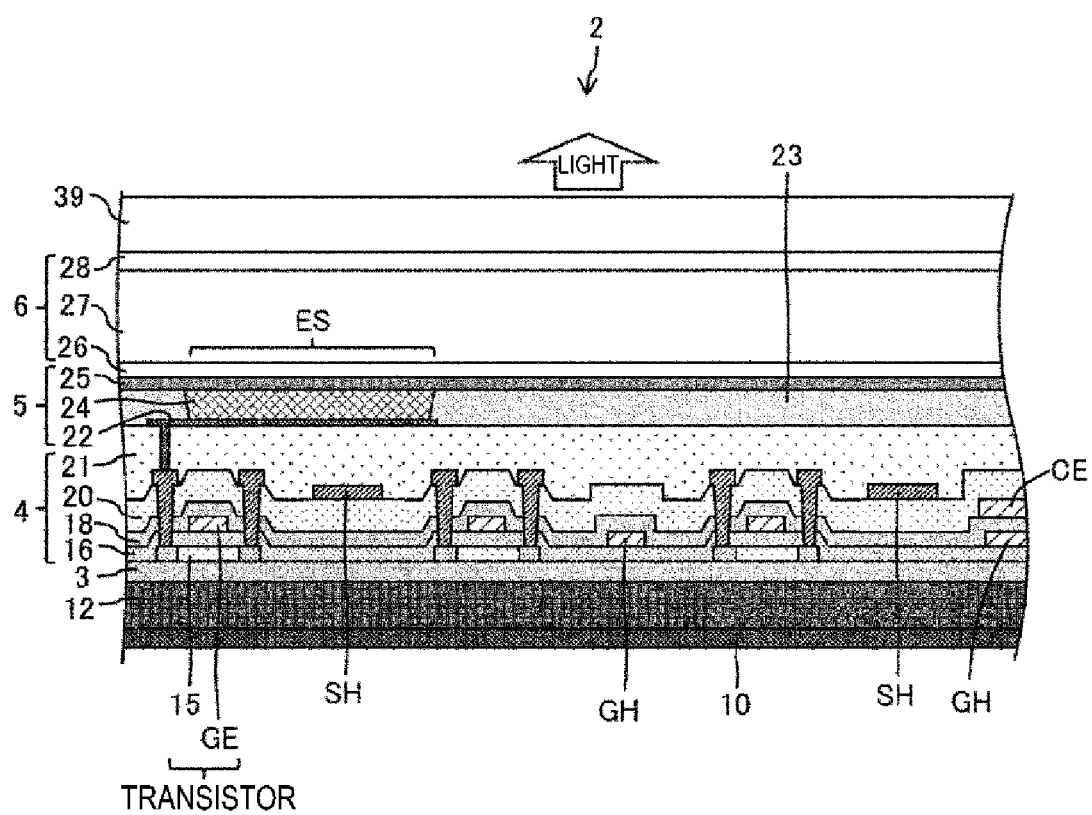
FIG. 2 is a cross-sectional view illustrating an example of a configuration of a display region of the display device.

FIG. 1 is a flowchart illustrating an example of a manufacturing method of a display device 2. FIG. 2 is a cross-sectional view illustrating an example of a configuration of a display region of the display device 2.

In a case where a flexible display device is manufactured, as illustrated in FIGS. 1 and 2, first, a resin layer 12 is formed on a transparent support substrate (for example, mother glass) (step S1). Next, a harrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 by irradiation of laser light and the like (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded to the obtained individual pieces (step S10). Next, an electronic circuit board (for example, an IC chip and an FPC) is mounted on a part (terminal portion) outside the display region (non-display region, frame) in which a plurality of subpixels are formed (step S11). Note that steps S1 to S11 are performed by a display device manufacturing apparatus (including a film formation apparatus that performs each step of steps S1 to S5).

The display device 2 includes the plurality of subpixels in the display region. For example, one pixel is formed of a red subpixel, a green subpixel, and a blue subpixel.

Examples of a material of the resin layer 12 include a polyimide and the like. The portion of the resin layer 12 can he replaced with resin films (for example, polyimide films) layers and an inorganic insulating film sandwiched therebetween.

The barrier layer 3 is a layer for preventing foreign matters such as water or oxygen from entering the TFT layer 4 and the light-emitting element layer 5, and, for example, can be formed of a silicon oxide film, a silicon nitride film, or a silicon oxynitride film, or a layered film of these formed by CVD (chemical vapor deposition).

The TFT layer 4 includes a semiconductor film 15, an inorganic insulating film 16 (gate insulating film) in an upper layer overlying the semiconductor film 15, a gate electrode GE and a gate wiring line GH in an upper layer overlying the inorganic insulating film 16, an inorganic insulating film 18 in an upper layer overlying the gate electrode GE and the gate wiring line GH, a capacitance electrode CE in an upper layer overlying the inorganic insulating film 18, an inorganic insulating film 20 in an upper layer overlying the capacitance electrode CE, a source wiring line SH in an upper layer overlying the inorganic insulating film 20, and a flattening film 21 (interlayer insulating film) in an upper layer overlying the source wiring line SH.

The semiconductor film 15 is formed of, for example, a low-temperature polysilicon (LIPS) or an oxide semiconductor (for example, an In—Ga—Zn—O based semiconductor), and a thin film transistor (TFT) is formed so as to include the semiconductor film 15 and the gate electrode GE. The transistor is illustrated as a top gate structure in FIG. 2, but may be a bottom gate structure.

The gate electrode GE, the gate wiring line GH, the capacitance electrode CE, and the source wiring line SH are each formed of a single layer film or a layered film of metal including at least one of aluminum, tungsten, molybdenum, tantalum, chromium, titanium, and copper, for example. A semiconductor layer in one layer and metal layers in three layers are included in the TFT layer 4 in FIG. 2.

The inorganic insulating films 16, 18, and 20 can he formed of, for example, a silicon oxide (SiOx) film or a silicon nitride (SiNx) film, or a layered film of these formed by CVD. The flattening film 21 can be formed of, for example, a coatable organic material such as a polyimide and acrylic.

The light-emitting element layer 5 includes an anode 22 in an upper layer overlying the flattening film 21, an edge cover 23 that covers an edge of the anode 22 and has insulating properties, an electroluminescence (EL) layer 24 in an upper layer overlying the edge cover 23, and a cathode 25 in an upper layer overlying the EL layer 24. The edge cover 23 is formed by applying an organic material such as a polyimide and acrylic and then patterning the organic material by photolithography, for example, On a subpixel-by-subpixel basis, a light-emitting element ES (for example, OLED: organic light emitting diode, QLED: quantum dot light emitting diode) including the anode 22, the EL layer 24, and the cathode 25 in an island shape is formed in the light-emitting element layer 5, and a subpixel circuit that drives and controls the light-emitting element ES (display element) is formed in the TFT layer 4.

For example, the EL layer 24 is formed by layering a hole injection layer, a hole transport layer, a light-emitting layer, an electron transport layer, and an electron injection layer in this order, from the lower layer side. The light-emitting layer is formed in an island shape in an opening of the edge cover 23 (on a subpixel-by-subpixel basis) by vapor deposition or an ink-jet method. Other layers are formed in an island shape or a solid-like shape (common layer). A configuration is also possible in which one or more layers are not formed, out of the hole injection layer, the hole transport layer, the electron transport layer, and the electron injection layer.

When the light-emitting layer of the OLED is formed by vapor deposition, a fine metal mask (FMM) is used. The FMM is a sheet (for example, made of an invar material) having a large number of openings, and a light-emitting layer (corresponding to one subpixel) in an island shape is formed with an organic material passing through one opening.

The light-emitting layer of the QLED can form a tight-emitting layer (corresponding to one subpixel) in an island shape by ink-jet applying a solvent having quantum dots diffused therein, for example.

The anode (anode electrode) 22 is formed by layering of indium Tin Oxide (ITO) and silver (Ag) or an alloy containing Ag, for example, and has light reflectivity. The cathode (cathode electrode) 25 can be formed of a transparent conductive material such as a MgAg alloy (extremely thin film), ITO, and indium zinc Oxide (IZO).

In a case where the tight-emitting element ES is the OLED, positive holes and electrons recombine inside the light-emitting layer in response to a drive current between the anode 22 and the cathode 25, and light is emitted as a result of excitons, which are generated by the recombination, in a process of a transition to a ground state. Since the cathode 25 is transparent and the anode 22 has light reflectivity, the light emitted from the EL layer 24 travels upward and becomes top-emitting.

In a case where the light-emitting element ES is the QLED, positive holes and electrons recombine inside the light-emitting layer in response to a drive current between the anode 22 and the cathode 25, and light (fluoresce) is emitted as a result of excitons, which are generated by the recombination, in a process of a transition from a conduction band to a valence band of quantum dots.

A light-emitting element (such as an inorganic light emitting diode) other than the OLED and the QLED described above may be formed in the light-emitting element layer 5.

The sealing layer 6 is transparent, and includes an inorganic sealing film 26 that covers the cathode 25, an organic buffer film 27 in an upper layer overlying the inorganic sealing film 26, and an inorganic sealing film 28 in an upper layer overlying the organic buffer film 27. The sealing layer 6 that covers the light-emitting element layer 5 inhibits foreign matters, such as water and oxygen, from penetrating to the light-emitting element layer 5.

Each of the inorganic sealing film 26 and the inorganic sealing film 28 is an inorganic insulating film, and can he formed of, for example, a silicon oxide film, a silicon nitride film, or a silicon oxynitride film, or a layered film of these formed by CVD. The organic buffer film 27 is a transparent organic film having a flattening effect, and can be formed of a coatable organic material such as acrylic. The organic buffer film 27 can be formed by, for example, ink-jet application, but a bank for stopping liquid droplets may be provided in the non-display region.

The lower face film 10 is, for example, a PET film bonded to the lower face of the resin layer 12 after the support substrate is peeled off, for achieving a display device with excellent flexibility. The function film 39 has at least one of an optical compensation function, a touch sensor function, and a protection function, for example.

The flexible display device is described above, but in a case of manufacturing a non-flexible display device, since formation of a resin layer, replacement of a base material and the like are generally unnecessary, a layering step in steps S2 to S5 is performed on a glass substrate and the process then proceeds to step S9, for example.

First Embodiment

Figure 3:
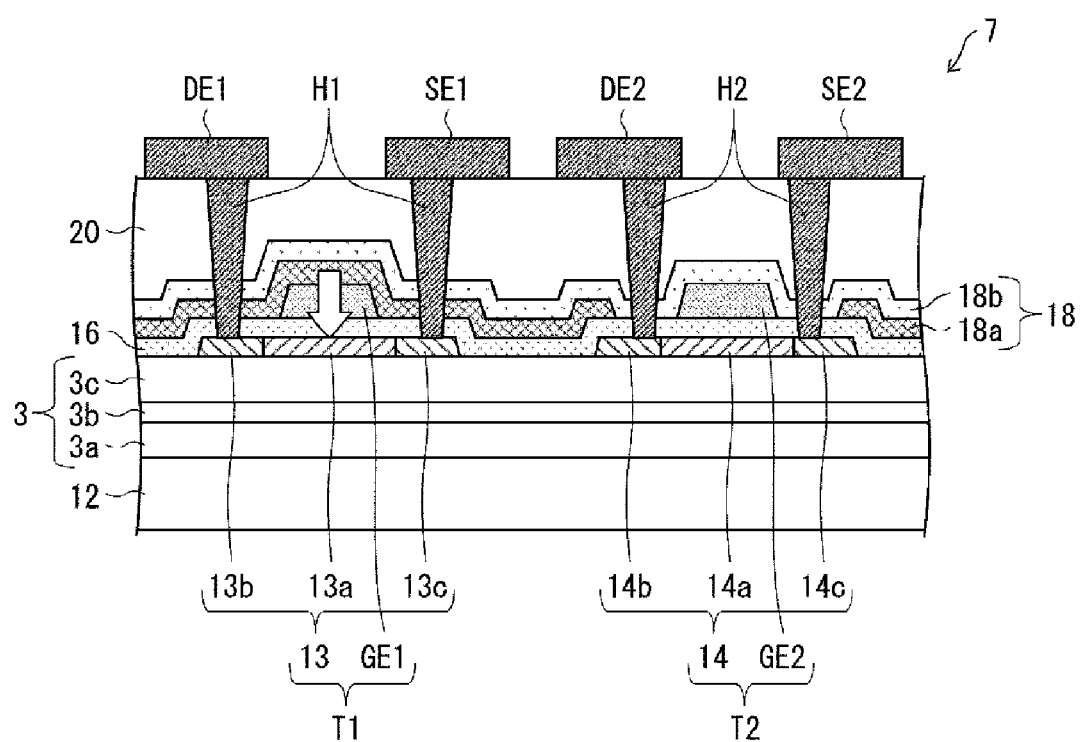
FIG. 3 is a cross-sectional view illustrating a configuration example of an active matrix substrate.

FIG. 3 is a cross-sectional view illustrating a configuration example of an active matrix substrate 7. The active matrix substrate 7 is a substrate including the resin layer 12, the barrier layer 3, and the TFT layer 4 illustrated in FIG. 2, for example. The light-emitting element layer 5 is layered on the active matrix substrate 7. In FIG. 3, the flattening film 21 formed in an upper layer overlying the inorganic insulating film 20 is omitted from the drawing. In FIG. 3, the inorganic insulating film 20 is drawn flat for ease, but the upper face of the inorganic insulating film 20 may have irregularities in conformance with a shape of the lower layer. Note that the formation of the inorganic insulating film 20 may be omitted.

The barrier layer 3 includes a first barrier layer 3a that is a silicon oxide film, a second barrier layer 3b that is a silicon nitride film, and a third barrier layer 3c that is a silicon oxide film. The second barrier layer 3b is disposed between the first barrier layer 3a and the third barrier layer 3c.

The TFT layer 4 includes a plurality of first transistors T1, a plurality of second transistors T2, a plurality of first contact holes H1, a plurality of second contact holes H2, a plurality of first source electrodes SE1, a plurality of second source electrodes SE2, a plurality of first drain electrodes DE1, and a plurality of second drain electrodes DE2 in addition to the inorganic insulating film 16 (gate insulating film), the inorganic insulating film 18, and the inorganic insulating film 20.

The plurality of first transistors T1 and the plurality of second transistors T2 are low-temperature polysilicon transistors. The first transistor T1 and the second transistor T2 may be a thin film transistor of a p-type or an n-type, but will be described here as being the p-type.

The first transistor T1 includes a first semiconductor film 13 (first semiconductor) and a first gate electrode GE1. An inorganic insulating film 16 that is a gate insulating film is disposed between the first semiconductor film 13 and the first gate electrode GE1. The first semiconductor film 13 includes a drain region 13b, a source region 13c, and a channel region 13a between the drain region 13b and the source region 13c. The first semiconductor film 13 is formed of a low-temperature polysilicon.

The second transistor T2 includes a second semiconductor film 14 (second semiconductor) and a second gate electrode GE2. The inorganic insulating film 16 that is a gate insulating film is disposed between the second semiconductor film 14 and the second gate electrode GE2. The second semiconductor film 14 includes a drain region 14b, a source region 14c, and a channel region 14a between the drain region 14b and the source region 14c. The second semiconductor film 14 is formed of a low-temperature polysilicon. The second semiconductor film 14 is formed of the same material as the material of the first semiconductor film 13 and formed in the same layer (layer formed in the same step) as the first semiconductor film 13.

The inorganic insulating film 18 includes a first protection layer 18a and a second protection layer 18b. The first protection layer 18a is a silicon nitride film. The second protection layer 18b is a silicon oxide film. The first protection layer 18a is formed on the inorganic insulating film 16 and the first gate electrode GE1. The second protection layer 18b is formed on the first protection layer 18a and the second gate electrode GE2.

The first protection layer 18a overlaps the entire first semiconductor film 13 of the first transistor T1. Note that the first protection layer 18a may overlap at least a part of the channel region 13a of the first semiconductor film 13. However, a proportion of an area that overlaps the first protection layer 18a in the entire area of the channel region 13a is preferably great. The first protection layer 18a preferably overlaps the entire channel region 13a of the first semiconductor film 13.

On the other hand, the channel region 14a of the second semiconductor film 14 of the second transistor T2 does not overlap the first protection layer 18a. In the example illustrated in FIG. 3, the entire channel region 14a of the second semiconductor film 14 does not overlap the first protection layer 18a. The first protection layer 18a may overlap, for example, a portion of the second semiconductor film 14 other than the channel region (for example, an edge (the drain region 14b or the source region 14c) of the second semiconductor film 14). The first protection layer 18a may not need to overlap the second semiconductor film 14.

The second protection layer 18b overlaps the first semiconductor film 13 of the first transistor T1 and the second semiconductor film 14 of the second transistor T2. The inorganic insulating film 20 is formed on the second protection layer 18b.

The plurality of first contact holes H1 are formed so as to extend through the inorganic insulating film 16, the first protection layer 18a, the second protection layer 18b, and the inorganic insulating film 20. The plurality of second contact holes H2 are formed so as to extend through the inorganic insulating film 16, the second protection layer 18b, and the inorganic insulating film 20. The first drain electrode DE1, the first source electrode SE1, the second drain electrode DE2, and the second source electrode SE2 are formed on the inorganic insulating film 20.

One of the two first contact holes H1 provided for one first transistor T1 electrically connects the drain region 13b to the first drain electrode DE1 of the first transistor T1. The other first contact hole H1 electrically connects the source region 13c to the first source electrode SE1 of the first transistor T1.

One of the two second contact holes H2 provided for one second transistor T2 electrically connects the drain region 14b of the second transistor T2 to the second drain electrode DE2. The other second contact hole H2 electrically connects the source region 14c to the second source electrode SE2 of the second transistor T2. The second drain electrode DE2 is connected to the anode 22 through a different contact hole extending through the inorganic insulating film 20 (see FIG. 2).

The active matrix substrate 7 includes a plurality of pixel circuits corresponding to the plurality of subpixels in the display region. The pixel circuit drives the light-emitting element ES (see FIG. 2). The pixel circuit includes one or more first transistors T1 as switching transistors, and includes the second transistor T2 as a drive transistor that drives the light-emitting element ES. The pixel circuit also includes a capacitance. The second gate electrode GE2 of the second transistor T2 is electrically connected to one end of the capacitance (for example, the capacitance electrode CE). A gray scale signal corresponding to a display gray scale is supplied to one end of the capacitance. A voltage corresponding to a gray scale to be displayed is applied between the source region 14c and the second gate electrode GE2 of the second transistor T2. In this way, the second transistor T2 passes a drive current corresponding to the gray scale between the source region 14c and the drain region 14b. The second transistor T2 causes the light-emitting element ES to emit light according to the gray scale by supplying the drive current corresponding to the gray scale to the light-emitting element ES. On and off (conduction state and non-conduction state) of the first transistor T1 as a switching transistor is controlled by, for example, a binary control signal. For example, a scanning signal or a light emission control signal is supplied to the first gate electrode GE1 of the first transistor T1. Note that one pixel circuit may include a plurality of switching transistors. The plurality of switching transistors may include a switching transistor controlled by the scanning signal and a switching transistor controlled by the light emission control signal. The light emission control signal defines a light emission period and a non-light emission period of the light-emitting element ES in one frame regardless of a display gray scale. Note that, for example, among the plurality of switching transistors, the second transistor T2 may be used as a transistor (for example, a transistor connected to a capacitance) preferably having a small threshold voltage (a great absolute value).

Figure 4:
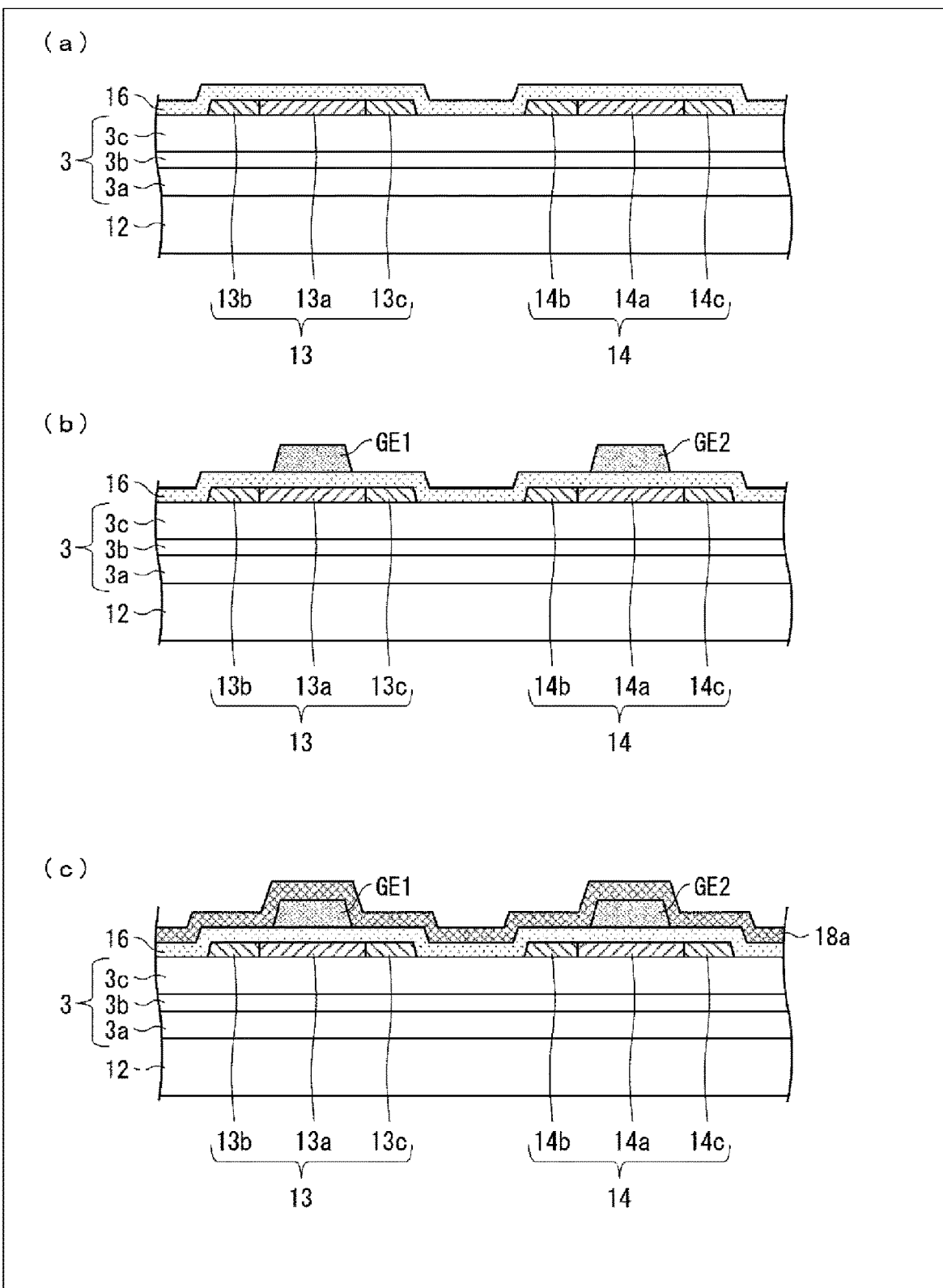
FIG. 4 is a cross-sectional view exemplifying a part of a manufacturing step of the active matrix substrate.
Figure 5:
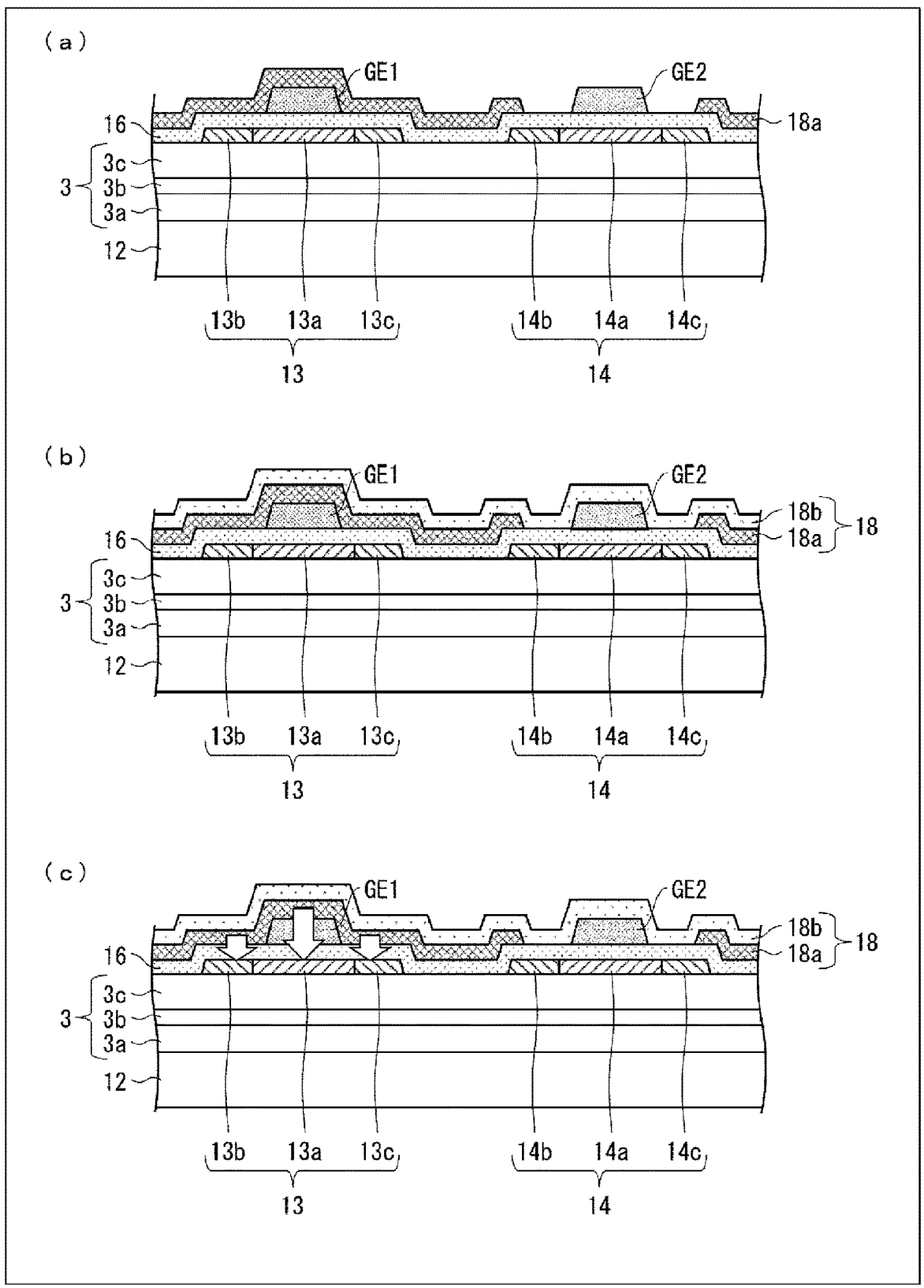
FIG. 5 is a cross-sectional view exemplifying a part of a manufacturing step of the active matrix substrate.

FIGS. 4 and 5 are cross-sectional views exemplifying a part of a manufacturing step of the active matrix substrate 7. In (a) of FIG. 4, film formation up to the inorganic insulating film 16 is completed. First, the barrier layer 3 is formed on the resin layer 12. The first semiconductor film 13 and the second semiconductor film 14 are formed on the barrier layer 3. The inorganic insulating film 16 that is a gate insulating film is formed on the first semiconductor film 13 and the second semiconductor film 14.

As illustrated in (b) of FIG. 4, the first gate electrode GE1 and the second gate electrode GE2 are formed on the inorganic insulating film 16.

As illustrated in (c) of FIG. 4, next, the first protection layer 18a that is a silicon nitride film is formed on the first gate electrode GE1 and the second gate electrode GE2 by, for example, CVD. A hydrogen compound (monosilane and ammonia) is included in material gas of the silicon nitride in CVD. When the silicon nitride film is formed, some H (hydrogen atoms) remain in the silicon nitride. At this point, the second gate electrode GE2 in addition to the first gate electrode GE1 is also covered with the first protection layer 18a.

As illustrated in (a) of FIG. 5, next, the first protection layer 18a above the second semiconductor film 14 is removed by etching, for example. Here, the first protection layer 18a is removed such that the first protection layer 18a does not overlap the channel region 14a of the second semiconductor film 14. Here, the first protection layer 18a overlaps a part of the drain region 14b and a part of the source region 14c of the second semiconductor film 14, but the first protection layer 18a may be removed such that the first protection layer 18a does not overlap the second semiconductor film 14. The first protection layer 18a formed in this manner does not overlap the channel region 14a of the second semiconductor film 14. Note that the first protection layer 18a overlaps the entire first semiconductor film 13.

As illustrated in (b) of FIG. 5, next, the second protection layer 18b that is a silicon oxide film is formed on the first protection layer 18a and the second gate electrode GE2 by, for example, CVD. The second protection layer 18b covers not only the first gate electrode GE1 but also the second gate electrode GE2. The second protection layer 18b overlaps the entire first semiconductor film 13 and the entire second semiconductor film 14.

As illustrated in (c) of FIG. 5, next, annealing of the active matrix substrate 7 is performed. The annealing is performed mainly for hydrogenating the channel region 13a of the first semiconductor film 13. Note that the annealing may be performed after the inorganic insulating film 20 in an upper layer overlying the second protection layer 18b is formed, after the first drain electrode DE1, the second drain electrode DE2, and the like in an upper layer overlying the inorganic insulating film 20 are formed, or after the flattening film 21 in an upper layer overlying the first drain electrode DE1 and the like is formed.

Specifically, the annealing is performed by baking the active matrix substrate 7 under a nitrogen atmosphere and at a higher temperature (for example, 400° C.) than that in CVD. In this way, a bond between the hydrogen atoms in the first protection layer 18a (silicon nitride film) is broken, and the hydrogen atoms diffuse around the first protection layer 18a. The hydrogen atoms pass through the inorganic insulating film 16 and diffuse into the first semiconductor film 13. In this way, particularly the channel region 13a of the first semiconductor film 13 formed of a low-temperature polysilicon is hydrogenated, and a switching characteristic of the first transistor T1 is improved. An arrow in (c) of FIG. 5 schematically represents an effect of the hydrogenation. In practice, the hydrogen atoms may bypass the first gate electrode GE1 and diffuse.

On the other hand, the channel region 14a of the second semiconductor film 14 does not overlap the first protection layer 18a (silicon nitride film). Thus, the channel region 14a of the second semiconductor film 14 is not hydrogenated. Alternatively, the channel region 14a of the second semiconductor film 14 has a smaller proportion of an area that overlaps the first protection layer 18a than that of the channel region 13a of the first semiconductor film 13. Thus, the channel region 14a of the second semiconductor film 14 has a smaller degree of the hydrogenation than that of the channel region 13a of the first semiconductor film 13.

Figure 6:
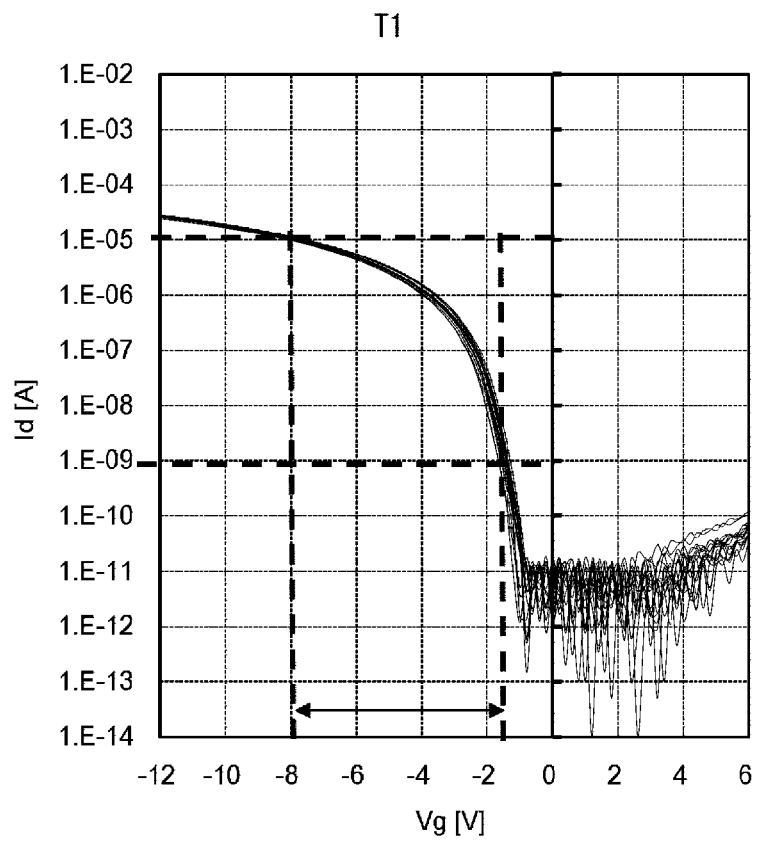
FIG. 6 is a diagram illustrating a voltage-current characteristic of a first transistor.
Figure 7:
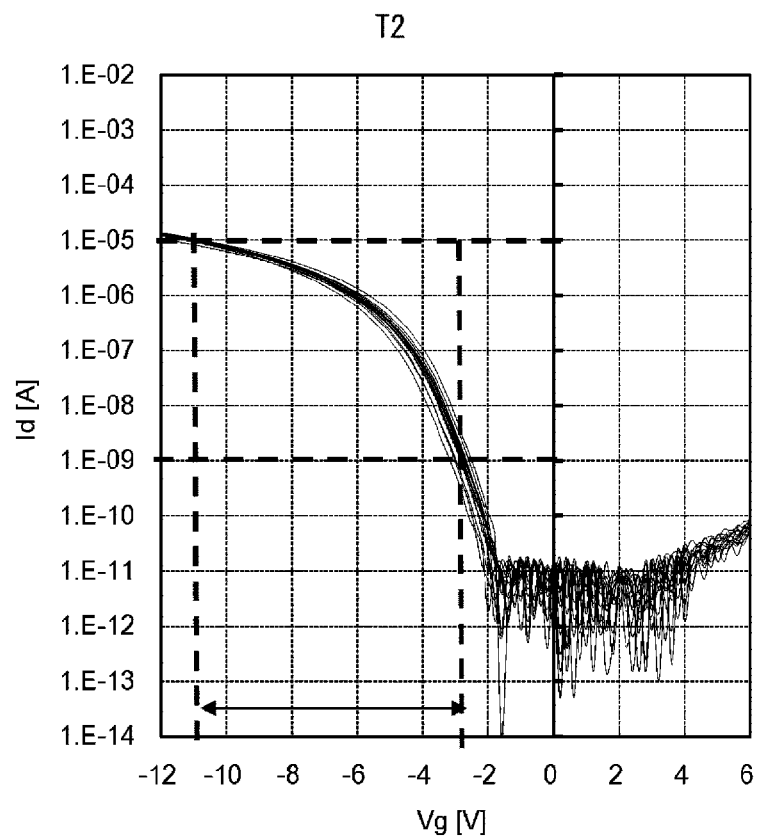
FIG. 7 is a diagram illustrating a voltage-current characteristic of a second transistor.

FIG. 6 is a diagram illustrating a voltage-current characteristic of the first transistor T1. FIG. 7 is a diagram illustrating a voltage-current characteristic of the second transistor T2. FIGS. 6 and 7 illustrate a source-drain current Id [A] with respect to a gate voltage Vg [V]. Here, it is assumed that conditions such as size (conditions other than the hydrogenation) are the same for the first transistor T1 and the second transistor T2. When the semiconductor (channel region) is hydrogenated, an S value of the transistor decreases and a threshold voltage Vth of the transistor increases (an absolute value decreases). The first transistor T1 is hydrogenated greater than the second transistor T2. A threshold voltage of the first transistor T1 is about $-2$ V, and a threshold voltage of the second transistor T2 is about $-4$ V. An S value of the first transistor T1 is about 0.3 V/decade, and an S value of the second transistor T2 is about 1 V/decade. From the OFF state (non-conduction state) to the ON state (conduction state), the first transistor T1 has a steeper rise of a current than that of the second transistor T2. Thus, the first transistor T1 has a faster response speed and more excellent performance as a switching transistor than those of the second transistor T2.

On the other hand, a drive transistor that drives the light-emitting element ES preferably has a great S value. When the S value is great, a rise of a current is gentle from the OFF state (non-conduction state) to the ON state (conduction state). For example, consideration is given to a case where a gray scale of the light-emitting element ES is controlled by passing a current in a range of, for example, $1.0 \times 10^{-9}$ to $1.0 \times 10^{-5}$ to the light-emitting element ES. When the first transistor TI is used as the drive transistor, as illustrated in FIG. 6, the entire range of the gray scale is represented by a gate voltage in a range of $-1.5$ V to $-8$ V. In contrast, when the second transistor T2 is used as the drive transistor, as illustrated in FIG. 7, the entire range of the gray scale is represented by a gate voltage in a range of $-2.8$ V to $-10.8$ V. The range of the gate voltage when the second transistor T2 is used is wider, and thus the gray scale of the light-emitting element ES can be controlled more accurately and/or in more gray scales.

For example, in a case where a plurality of transistors in one pixel circuit have the same degree of hydrogenation, either one of a property suitable for a switching transistor or a property suitable for a drive transistor needs to be selected for a property of all of the transistors.

On the other hand, as in the present embodiment, a plurality of transistors having different degrees of the hydrogenation can be formed on one substrate by partially forming or partially removing the first protection layer 18a (silicon nitride film) that overlaps the semiconductor film of the plurality of transistors. In turn, the plurality of transistors having different degrees of the hydrogenation can be formed in one pixel circuit. In this way, the plurality of transistors having properties (S value or threshold value) different from each other can be formed in one pixel circuit. Thus, a switching transistor and a drive transistor in one pixel circuit can each be a transistor having a more suitable characteristic.

Note that the first protection layer 18a may be formed such that there is a hole in a place of the first protection layer 18a that overlaps the channel region 14a of the second transistor T2 when the active matrix substrate 7 is viewed in a plan view. Alternatively, the plurality of first protection layers 18a formed in an island shape that are separated from each other may be provided so as to overlap the channel region 14a of the plurality of first transistors T1 when the active matrix substrate 7 is viewed in the plan view.

Further, the forming order of the first protection layer 18a and the second protection layer 18b may be reversed. For example, the second protection layer 18b may be formed on the first gate electrode GE1 and the second gate electrode GE2, and then the first protection layer 18a may be formed on the second protection layer 18b.

Second Embodiment

Another embodiment of the disclosure will be described below. Note that, for the convenience of description, members having the same functions as the members described in the foregoing embodiment will be given the same reference signs, and descriptions thereof will not be reiterated.

Figure 8:
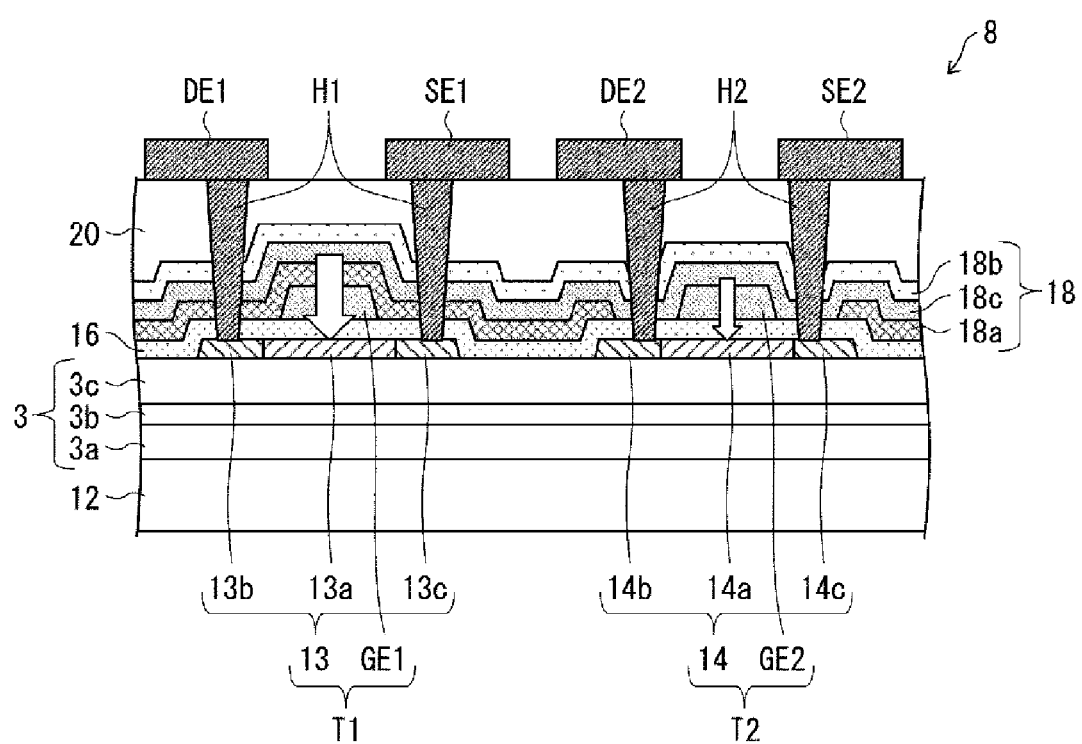
FIG. 8 is a cross-sectional view illustrating a configuration example of the active matrix substrate.

FIG. 8 is a cross-sectional view illustrating a configuration example of an active matrix substrate 8. In the active matrix substrate 8, an inorganic insulating film 18 includes a first protection layer 18a, a third protection layer 18c, and a second protection layer 18b. The first protection layer 18a is a silicon nitride film. The third protection layer 18c is a silicon nitride film. The second protection layer 18b is a silicon oxide film. The third protection layer 18c is formed between the first protection layer 18a and the second protection layer 18b.

A plurality of first contact holes H1 are formed so as to extend through an inorganic insulating film 16, the first protection layer 18a, the third protection layer 18c, the second protection layer 18b, and an inorganic insulating film 20. A plurality of second contact holes H2 are formed so as to extend through the inorganic insulating film 16, the third protection layer 18c, the second protection layer 18b, and the inorganic insulating film 20.

The third protection layer 18c overlaps a first semiconductor film 13 of a first transistor T1 and a second semiconductor film 14 of a second transistor T2. A channel region 13a of the first semiconductor film 13 of the first transistor T1 overlaps the first protection layer 18a and the third protection layer 18c that are a silicon nitride film. On the other hand, a channel region 14a of the second semiconductor film 14 of the second transistor T2 does not overlap the first protection layer 18a, and overlaps the third protection layer 18c.

In a manufacturing step, for example, after the first protection layer 18a is partially removed, the third protection layer 18c that is a silicon nitride film is formed by CVD, for example. Annealing is also performed similarly to the first embodiment.

In this way, in the active matrix substrate 8, the first transistor T1 and the second transistor T2 have a different number of overlapping silicon nitride films. A thickness of the silicon nitride film overlapping the first transistor T1 and a thickness of the silicon nitride film overlapping the second transistor T2 are different from each other. A thickness of the silicon nitride film overlapping the channel region 13a of the first transistor T1 is greater than a thickness of the silicon nitride film overlapping the channel region 14a of the second transistor T2. Thus, the channel region 13a of the first transistor T1 has a greater degree of hydrogenation by annealing than that of the channel region 14a of the second transistor T2. An arrow in FIG. 8 schematically represents a degree of the hydrogenation. In this way, an S value of the first transistor T1 is smaller than an S value of the second transistor T2. In the present embodiment, a degree of the hydrogenation of the first transistor T1 and the second transistor T2 can be adjusted by a thickness (number) of the silicon nitride film.

Note that the formation order of the first protection layer 18a, the second protection layer 18b, and the third protection layer 18c is not limited thereto, and is optional. For example, the second protection layer 18b may be disposed between the first protection layer 18a and the third protection layer 18c.

Supplement

An electro-optical element (an electro-optical element whose luminance and transmittance are controlled by a current) that is provided in a display device according to the present embodiment is not particularly limited thereto. Examples of the display device according to the present embodiment include an organic Electro Luminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The disclosure also includes, for example, the following aspects.

First Aspect

An active matrix substrate including:

a first transistor being a low-temperature polysilicon transistor, the first transistor including a first semiconductor film and a first gate electrode;

a second transistor including a second semiconductor film formed of the same material as a material of the first semiconductor film and formed in the same layer as the first semiconductor film, and a second gate electrode;

a plurality of first contact holes extending through a gate insulating film, a first protection layer being a silicon nitride film, and a second protection layer; and a plurality of second contact holes extending through the gate insulating film and the second protection layer, wherein a source region and a drain region of the first semiconductor film of the first transistor are electrically connected to a first source electrode and a first drain electrode via the plurality of first contact holes, respectively, a source region and a drain region of the second semiconductor film of the second transistor are electrically connected to a second source electrode and a second drain electrode via the plurality of second contact holes, respectively, and a channel region between the source region and the drain region of the second transistor does not overlap the first protection layer.

Second Aspect

The active matrix substrate according to aspect 1, wherein the first protection layer is disposed between the gate insulating film and the second protection layer.

Third Aspect

The active matrix substrate according to aspect 1 or 2, further including a third protection layer being a silicon nitride film, the third protection layer being disposed between the first protection layer and the second protection layer, wherein the plurality of first contact holes extend through the gate insulating film, the first protection layer, the third protection layer, and the second protection layer, and the plurality of second contact holes extend through the gate insulating film, the third protection layer, and the second protection layer.

Fourth Aspect

The active matrix substrate according to any of aspects 1 to 3, wherein the first protection layer does not overlap the second semiconductor film.

Fifth Aspect

The active matrix substrate according to any of aspects 1 to 3, wherein the first protection layer overlaps a portion of the second semiconductor film other than the channel region.

Sixth Aspect

The active matrix substrate according to any of aspects 1 to 5, wherein the first protection layer entirely overlaps the first semiconductor film.

Seventh Aspect

The active matrix substrate according to any of aspects 1 to 5, wherein a channel region between the source region and the drain region of the first transistor overlaps the first protection layer.

Eighth Aspect

The active matrix substrate according to any of aspects 1 to 7, including:

a plurality of the first transistors; and a plurality of the first protection layers formed in an island shape that are separated from each other, the plurality of first protection layers overlapping the plurality of first transistors respectively.

Ninth Aspect

The active matrix substrate according to any of aspects 1 to 8, further including a pixel circuit configured to drive a display element in a display region, wherein the pixel circuit includes the first transistor as a switching transistor, and includes the second transistor as a drive transistor configured to drive the display element.

Tenth Aspect

The active matrix substrate according to aspect 9, wherein a drive current flowing through the second transistor is supplied to the display element.

Eleventh Aspect

The active matrix substrate according to aspect 9 or 10, wherein the pixel circuit includes a capacitance, and the second gate electrode of the second transistor is electrically connected to one end of the capacitance.

Twelfth Aspect

The active matrix substrate according to any of aspects 9 to 11, wherein a scanning signal is supplied to the first gate electrode of the first transistor.

Thirteenth Aspect

A display device including the active matrix substrate according to any one of aspects 1 to 12, the display device including a light-emitting element layer layered on the active matrix substrate, wherein the light-emitting element layer includes a plurality of display elements.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. An active matrix substrate comprising:
 a first transistor being a low-temperature polysilicon transistor, the first transistor including a first semiconductor film and a first gate electrode;
 a second transistor including a second semiconductor film formed of the same material as a material of the first semiconductor film and formed in the same layer as the first semiconductor film, and a second gate electrode;
 a plurality of first contact holes extending through a gate insulating film, a first protection layer being a silicon nitride film, and a second protection layer;
 a plurality of second contact holes extending through the gate insulating film and the second protection layer; and
 a third protection layer being a silicon nitride film, the third protection layer being disposed between the first protection layer and the second protection layer,
 wherein a source region and a drain region of the first semiconductor film of the first transistor are electrically connected to a first source electrode and a first drain electrode via the plurality of first contact holes, respectively,
 a source region and a drain region of the second semiconductor film of the second transistor are electrically connected to a second source electrode and a second drain electrode via the plurality of second contact holes, respectively,
 a channel region between the source region and the drain region of the second transistor does not overlap the first protection layer,
 the plurality of first contact holes extend through the gate insulating film, the first protection layer, the third protection layer, and the second protection layer, and
 the plurality of second contact holes extend through the gate insulating film, the third protection layer, and the second protection layer.

2. The active matrix substrate according to claim 1, wherein the first protection layer does not overlap the second semiconductor film.

3. The active matrix substrate according to claim 1,
wherein the first protection layer overlaps a portion of the second semiconductor film other than the channel region.
4. The active matrix substrate according claim 1,
wherein the first protection layer entirely overlaps the first semiconductor film.
5. The active matrix substrate according to claim 1,
wherein a channel region between the source region and the drain region of the first transistor overlaps the first protection layer.
6. The active matrix substrate according to claim 1, comprising:
a plurality of the first transistors; and
a plurality of the first protection layers formed in an island shape that are separated from each other, the plurality of first protection layers overlapping the plurality of first transistors respectively.
7. The active matrix substrate according to claim 1, further comprising
a pixel circuit configured to drive a display element in a display region,
wherein the pixel circuit includes the first transistor as a switching transistor, and includes the second transistor as a drive transistor configured to drive the display element.
8. A display device including the active matrix substrate according to claim 1, the display device comprising
a light-emitting element layer layered on the active matrix substrate,
wherein the light-emitting element layer includes a plurality of display elements.
9. An active matrix substrate comprising:
a first transistor being a low-temperature polysilicon transistor, the first transistor including a first semiconductor film and a first gate electrode;
a second transistor including a second semiconductor film formed of the same material as a material of the first semiconductor film and formed in the same layer as the first semiconductor film, and a second gate electrode;
a plurality of first contact holes extending through a gate insulating film, a first protection layer being a silicon nitride film, and a second protection layer;
a plurality of second contact holes extending through the gate insulating film and the second protection layer,
wherein a source region and a drain region of the first semiconductor film of the first transistor are electrically connected to a first source electrode and a first drain electrode via the plurality of first contact holes, respectively,
a source region and a drain region of the second semiconductor film of the second transistor are electrically connected to a second source electrode and a second drain electrode via the plurality of second contact holes, respectively,
a channel region between the source region and the drain region of the second transistor does not overlap the first protection layer, and
the first protection layer overlaps a portion of the second semiconductor film other than the channel region.
10. The active matrix substrate according to claim 9,
wherein the first protection layer is disposed between the gate insulating film and the second protection layer.
11. The active matrix substrate according to claim 9,
wherein the first protection layer does not overlap the second semiconductor film.
12. The active matrix substrate according claim 9,
wherein the first protection layer entirely overlaps the first semiconductor film.
13. The active matrix substrate according to claim 9,
wherein a channel region between the source region and the drain region of the first transistor overlaps the first protection layer.
14. The active matrix substrate according to claim 9, comprising:
a plurality of the first transistors; and
a plurality of the first protection layers formed in an island shape that are separated from each other, the plurality of first protection layers overlapping the plurality of first transistors respectively.
15. The active matrix substrate according to claim 9, further comprising
a pixel circuit configured to drive a display element in a display region,
wherein the pixel circuit includes the first transistor as a switching transistor, and includes the second transistor as a drive transistor configured to drive the display element.
16. A display device including the active matrix substrate according to claim 9, the display device comprising
a light-emitting element layer layered on the active matrix substrate,
wherein the light-emitting element layer includes a plurality of display elements.
17. An active matrix substrate comprising:
a first transistor being a low-temperature polysilicon transistor, the first transistor including a first semiconductor film and a first gate electrode;
a second transistor including a second semiconductor film formed of the same material as a material of the first semiconductor film and formed in the same layer as the first semiconductor film, and a second gate electrode;
a plurality of first contact holes extending through a gate insulating film, a first protection layer being a silicon nitride film, and a second protection layer;
a plurality of second contact holes extending through the gate insulating film and the second protection layer; and
a pixel circuit configured to drive a display element in a display region,
wherein a source region and a drain region of the first semiconductor film of the first transistor are electrically connected to a first source electrode and a first drain electrode via the plurality of first contact holes, respectively,
a source region and a drain region of the second semiconductor film of the second transistor are electrically connected to a second source electrode and a second drain electrode via the plurality of second contact holes, respectively,
a channel region between the source region and the drain region of the second transistor does not overlap the first protection layer, and
the pixel circuit includes the first transistor as a switching transistor, and includes the second transistor as a drive transistor configured to drive the display element.
18. The active matrix substrate according to claim 17,
wherein the first protection layer is disposed between the gate insulating film and the second protection layer.
19. The active matrix substrate according to claim 17,
wherein the first protection layer does not overlap the second semiconductor film.

20. The active matrix substrate according to claim 17, wherein the first protection layer overlaps a portion of the second semiconductor film other than the channel region.

* * * * *